United States Patent [19]  [11] Patent Number: 5,075,094
Morrish et al.  [45] Date of Patent: Dec. 24, 1991

[54] METHOD OF GROWING DIAMOND FILM ON SUBSTRATES

[75] Inventors: Arthur A. Morrish, LaPlata; Paul M. Natishan, Annapolis, both of Md.; William A. Carrington, Foster City, Calif.

[73] Assignee: The United States of America as represented by the Secretary of the Navy, Washington, D.C.

[21] Appl. No.: 516,585

[22] Filed: Apr. 30, 1990

[51] Int. Cl.⁵ .......................................... C01B 31/06
[52] U.S. Cl. ..................... 423/446; 156/DIG. 68; 427/39; 204/173
[58] Field of Search ............. 423/446; 156/DIG. 68, 156/610; 427/39; 204/173; 501/86

[56] References Cited

U.S. PATENT DOCUMENTS

| | | | |
|---|---|---|---|
| 3,348,918 | 10/1967 | Kruse | 423/446 |
| 3,661,526 | 5/1972 | Angus et al. | 156/DIG. 68 |
| 4,104,441 | 8/1978 | Fedoseev et al. | 423/446 |
| 4,434,188 | 2/1984 | Kamo et al. | 204/173 |
| 4,504,519 | 3/1985 | Zelez | 423/445 |
| 4,707,384 | 11/1987 | Schachner et al. | 427/249 |
| 4,717,622 | 1/1988 | Kurokawa et al. | 428/408 |
| 4,725,345 | 2/1988 | Sakamoto et al. | 204/192.31 |
| 4,734,339 | 3/1988 | Schachner et al. | 428/701 |
| 4,740,263 | 4/1988 | Imai et al. | 156/613 |
| 4,767,517 | 8/1988 | Hiraki et al. | 204/192.25 |
| 4,767,608 | 8/1988 | Matsumoto et al. | 156/DIG. 68 |
| 4,772,513 | 9/1988 | Sakamoto et al. | 428/408 |
| 4,816,286 | 3/1989 | Hirose | 427/39 |
| 4,816,291 | 3/1989 | Desphandey et al. | 427/38 |
| 4,822,466 | 4/1989 | Rabalais et al. | 204/192.15 |
| 4,830,702 | 5/1989 | Singh et al. | 156/613 |
| 4,839,195 | 6/1989 | Kitamura et al. | 427/38 |
| 4,842,937 | 6/1989 | Meyer et al. | 428/408 |
| 4,842,945 | 6/1989 | Ito et al. | 428/457 |
| 4,844,785 | 7/1989 | Kitabatake et al. | 204/192.11 |
| 4,849,290 | 7/1989 | Fujimori et al. | 428/408 |
| 4,851,254 | 7/1989 | Yamamoto et al. | 427/37 |
| 4,859,490 | 8/1989 | Ikegaya et al. | 427/38 |
| 4,859,493 | 8/1989 | Lemelson | 427/45.1 |
| 4,870,030 | 9/1989 | Markunas et al. | 437/81 |
| 4,940,015 | 7/1990 | Kobashi et al. | 156/DIG. 68 |

FOREIGN PATENT DOCUMENTS

| | | | |
|---|---|---|---|
| 62-196371 | 8/1987 | Japan | 423/446 |
| 62-241898 | 10/1987 | Japan | 423/446 |
| 1-157412 | 6/1989 | Japan | 423/446 |

Primary Examiner—Robert Kunemund
Attorney, Agent, or Firm—Thomas E. McDonnell; Barry A. Edelberg

[57] ABSTRACT

The deposition of diamond on a substrate is enhanced by coating the substrate surface with a thin layer of carbon before deposition. Preferably, the substrate is scratched before being coated with diamond. The carbon layer may be formed by applying an oil coating to the substrate and then heating the substrate to carbonize the coating, or by the evaporative deposition of carbon.

16 Claims, 6 Drawing Sheets

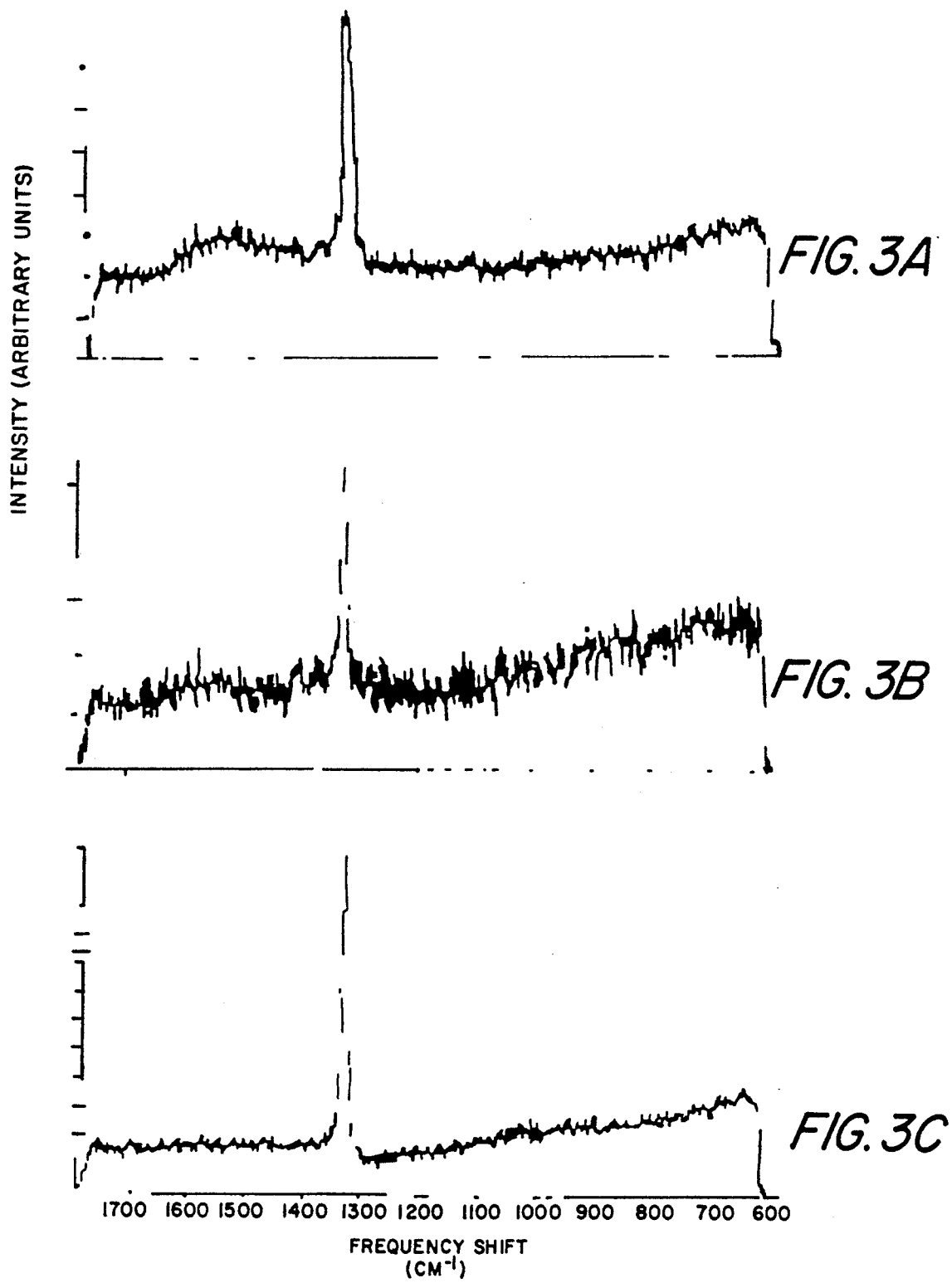

METHOD OF GROWING DIAMOND FILM ON SUBSTRATES

BACKGROUND OF THE INVENTION

1. Field of the Invention

The present invention relates generally to the deposition of diamond films on substrates, and more specifically to vapor deposition of diamond upon a substrate.

2. Description of the Prior Art

Metallic, inorganic, and organic coatings are applied to metals, alloys and other materials to prevent chemical corrosion, oxidation, or other forms of environmental degradation. Nevertheless, these coatings are not completely inert to the environment and eventually fail chemically and/or mechanically, thereby exposing the substrate.

Diamond is inert in a variety of environments including inorganic acids, bases, and organic solvents. Solutions such as hot aqua regia (a mixture of ⅔ hydrochloric acid and ⅓ nitric acid), hot aqua-fortis (⅔ sulfuric acid and ⅓ nitric acid), and hot caustic solutions (potassium hydroxide) have been used to clean diamond with no apparent damage to the diamond. Also, diamond is inert in chloride environments. For example, in an 8% $NH_4Cl$ solution, diamond was not degraded at potentials below 80 volts.

Diamond films have been produced at low pressures and on larger areas. Diamond films have high thermal conductivity, are electrically insulating, have a very good abrasion resistance, and desirable optical properties. These properties and the fact that diamond is inert in a variety of environments suggest that diamond films could be used as protective coatings.

Diamond films and microcrystals have been previously produced by Filament Assisted Chemical Vapor Deposition (FACVD). That technique consists of passing a mixture of hydrogen and a hydrocarbon gas, such as methane, over a filament heated to about 2000° C. The diamond is deposited on a substrate which is heated to about 800°-1000° C., and positioned near the filament. This work is done in a vacuum chamber at typical pressures of 20-100 torr. The material from which the diamond is actually produced is a mixture of hydrogen and methane. The proportion of these two gases is generally 100:1. Many researchers have noted that while diamond may be grown on a variety of materials (Mo, Ni, Cu, Si, SiC, WC, etc.), the nucleation density is enhanced when the surface of the material is scratched with diamond grit. Also diamond seems to nucleate strongly on areas of hydrocarbon contamination which are not removed during substrate cleaning.

SUMMARY OF THE INVENTION

Accordingly, it is an object of this invention to overcome the above-noted deficiencies of the prior art.

Another object of the present invention is to form a protective layer of diamond film upon a substrate.

A further object of the present invention is to enhance the density of diamond films deposited by FACVD.

These and additional objects of the invention are accomplished by abrading the surface of a substrate, depositing a thin layer of carbon having exposed diamond nucleation sites upon the abraded surface, heating the substrate and then depositing a diamond film by FACVD upon the coated surface of the substrate.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein:

FIGS. 3a, 3b and 3c are micro-Raman spectra of diamond films produced on Mo according to the present invention.

DETAILED DESCRIPTION OF THE PREFERRED EMBODIMENTS

Figure 1:
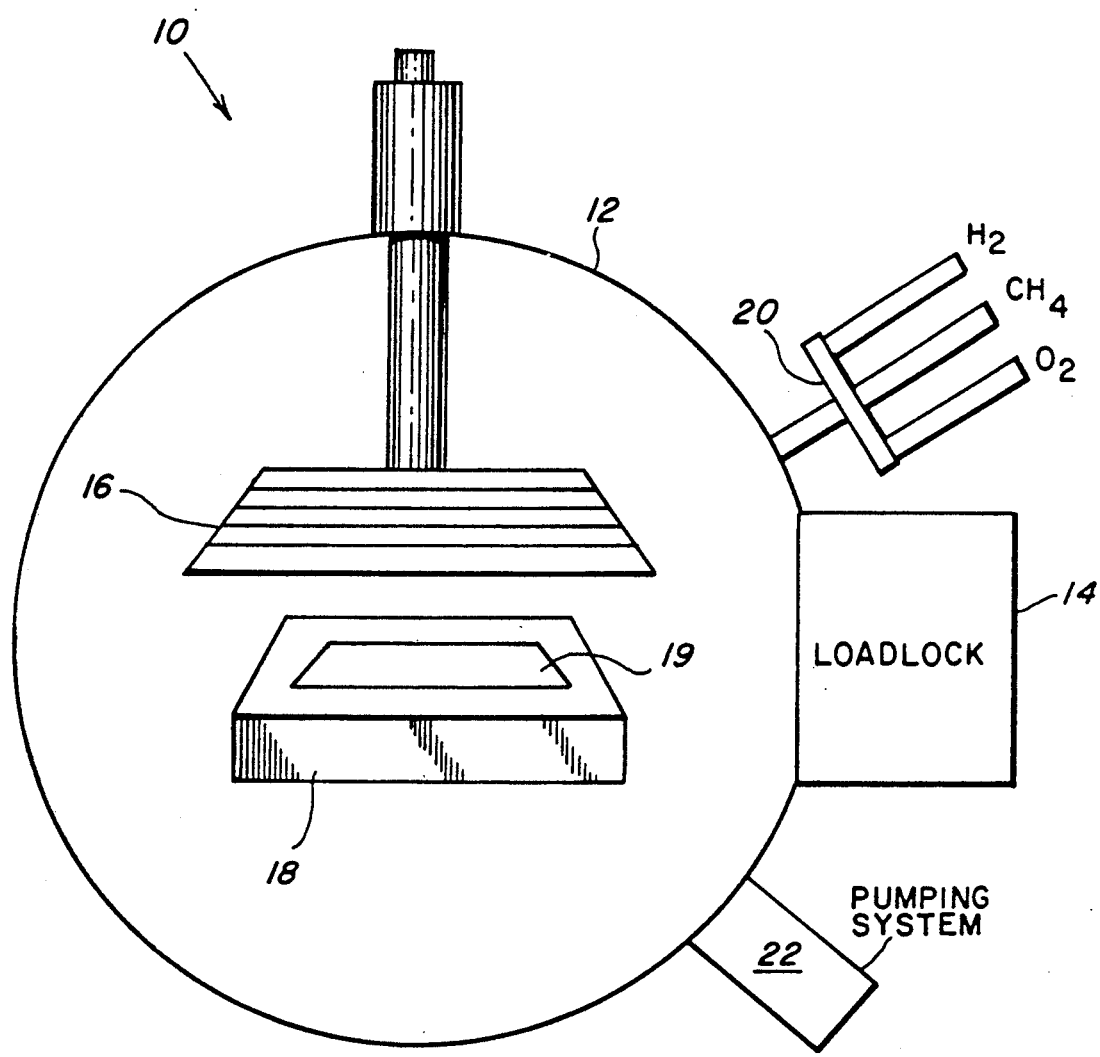
FIG. 1 shows a FACVD diamond deposition apparatus useful in the method of the present invention.

The major innovation of the present invention resides in the formation of an substantially evenly applied carbon film, having exposed diamond nucleation sites on the scratched surface of the substrate. Throughout this specification and the claims that follow, the term "selected pattern" means a pattern designed for a specific purpose and encompasses a complete or incomplete coating of the specified surface. Specifically, the term "selected pattern" is used to differentiate over a randomly formed patterns, such as one formed from fingerprint contamination. If a pattern comprising less than the entire specified surface is desired, the pattern may be selected by any conventional technique, such as selective sputtering or selective evaporation.

Initially, the surface of the substrate is scratched, preferably with diamond grit, in the region upon which the diamond is to be coated, to enhance nucleation by the formation of microscopic nucleation sites. Typically, the entire surface to be coated is scratched.

After the surface of the substrate is scratched, the surface is preferably cleaned. Any conventional method used to clean the substrate surface for coating a carbonaceous layer thereon should be satisfactory in the method of the present invention. For example, the substrate can be cleaned with a surfactant to remove large contaminants and ultrasonically cleaned in a fast drying solvent such as acetone in methanol to remove smaller contaminants, surface grease and oil. Alternatively, the surface can be cleaned by polishing, acid etching, trichloroethane or trichloroehylene, followed, in each case, by ultrasonic cleaning in a solvent bath. Surface cleaning provides a reproducible surface to start with, but may not be required.

Then, a selected pattern of a thin oil or carbon film is applied to the to-be-diamond-coated surface of the substrate. The method of applying the oil or carbon film is not critical. An oil film may be painted on the substrate for example, by smearing using an applicator such as a cotton swab, brush or spatula or by spraying The thin carbon film may be directly coated on the substrate, for example, by evaporative deposition using a standard electron microscope carbon coater.

If the scratched substrate surface is coated with oil, the oil layer should be sufficiently thick to ensure even coverage of the surface and so that upon evaporation and carbonization of the oil film, carbon or carbide nucleation sites form at the surface. If adhesion is of paramount importance, the coating of oil is should generally be as thin as practical, so that layers of graphite do not form on the surface. Otherwise, the maximum thickness is not critical Typically, an oil film sufficiently thick to form a carbon layer at least one molecule thick upon carbonization is applied to the scratched substrate surface. Theoretically, there is no upper limit on the thickness of the carbon layer. Usually, however, the layer will be less than 2 microns thick. More often, the carbon layer will be less than one micron thick.

If an oil coating is applied to the scratched substrate surface, the oil coating should then be carbonized. Carbonization is preferably done in a vacuum or a reducing atmosphere, to avoid oxidation of the carbon, at a temperature sufficiently high to decompose the oil to carbon quickly, but at a temperature low enough to avoid any undesired changes in the substrate structure. Generally, carbonization is done at diamond forming temperatures, thus permitting the equilibration of conditions appropriate for diamond deposition in the deposition chamber housing the coated substrate simultaneously with carbonization. Upon the heating required for carbonization, the oil will typically migrate over essentially the entire surface of the substrate.

If the carbon film is directly formed by evaporation onto the substrate, the carbon film should be at least one monolayer thick. Again, there is no upper limit on the thickness of the carbon layer, although the carbon layer will be less than 2 microns thick and most often less than one micron thick. Also, as is the case above, if adhesion is of paramount importance, the coating of oil is should generally be as thin as practical, so that layers of graphite do not form on the surface. Obviously, if the carbon film is formed directly, rather than via an oil coating, no carbonization step is required. Otherwise, the process according to the present invention proceeds similarly regardless of whether the nucleation enhancement coating is a carbon film or oil coating that is later carbonized.

The formation of the diamond coating upon the oil/carbon coated substrate may be done in any manner useful for FACVD of diamond upon that substrate, or any other process for depositing diamond upon that substrate, such as microwave deposition, which does not remove the oil/carbon coating before it has a chance to develop nucleation sites or react with the substrate to form a carbide.

Typically, in FACVD, a hydrocarbon feedstock, i.e., a mixture of hydrocarbon and hydrogen, is preheated by passing over a heating element to a temperature above that at which the hydrocarbon compound evaporates, decomposes and dissociates into active hydrogen and diamond-generating carbon atoms. This temperature is usually over about 1800° C. and is preferably over about 1700° C. Usually, higher temperatures result in faster diamond deposition. In the process of U.S. Pat. No. 4,851,254, (which is incorporated herein by reference) for example, the rate of diamond deposition is enhanced by using an arc discharge to decompose the hydrocarbon feedstock at above 3000°. After heating, the decomposed mixture is directed to the surface of the substrate, which is typically heated at between about 500° and 1300° C. During deposition, the pressure within the deposition chamber is generally maintained at between about 9 and 100 Torr, and preferably between about 20 and 100 Torr.

The length of time required for diamond growth depends, in a predictable way, upon the desired thickness and the deposition rate. The deposition rate depends predictably upon the rate at which decomposed hydrocarbon feedstock strikes the substrate surface. That rate can be controlled by varying the rate at which the hydrocarbon feedstock is fed into the deposition chamber and by varying the temperature at which the hydrocarbon is decomposed.

Substrates which can be coated according to the present invention include carbide-forming metals, such as Fe, Si and Mo, and any substance which can be coated with diamond using conventional techniques which do not remove the oil or carbon coating prior to the formation of diamond nucleation sites and do not destroy or incapacitate these diamond nucleation sites prior to the deposition of diamond thereon. In particular, carbide-forming metals or alloys and metals or alloys, such as Mo, Ni, Si, SiC, Ti, $SiN_4$, TiN, TiC and WC, are preferred. The present invention can also be used to coat Cu and Ag, which are not good carbide formers. While it is not desired to be bound by theory, it is believed that the present invention provides superior results by virtue of at least one of two possible mechanisms. In the case of carbide-forming metal substrates, the oil or evaporated carbon film forms, upon heating, a carbide bond with the substrate at the substrate/film interface. The amorphous carbon film (which, if oil is used, forms upon heating) binds to this carbide, thus strongly attaching the amorphous carbon film (which includes diamond nucleation sites on its outer surface) to the substrate. In the case of substrates which do not form carbides (and perhaps to some extent in carbide-forming substrates), interdiffusion probably occurs between the substrate and the amorphous carbon film, binding the amorphous carbon film to the substrate.

Having described the invention, the following examples are given to illustrate specific applications of the invention including the best mode now known to perform the invention. These specific examples are not intended to limit the scope of the invention described in this application.

EXAMPLES

As shown in FIG. 1, the FACVD system 10 used in the Examples consisted of: 12 inch diameter spherical vacuum chamber 12 having load lock 14 with eighteen ports of various sizes, movable large area rhenium filament 16 mounted on pyrolytic boron nitride supports, a substrate mount 18 with a boron nitride heater for heating substrate 19, a gas flow control system 20 capable of delivering four gases at flow rate of 10 to 500 SCCM, and a pumping system 22 that can achieve $1 \times 10^{-7}$ torr.

The diamond films were produced using a large area gridded rhenium filament which could coat substrates at least 3.0×4.5 cm in size. Filament temperature was approximately 2100°–2200° C. as measured by an optical pyrometer. Substrate heating was provided by a graphite heating element encased in pyrolytic boron nitride, as well as radiative heating from the filament. Substrate temperatures were maintained at approximately 850°±25° C. as measured by a tungsten rhenium thermocouple. The gas mixture used was hydrogen and methane at a flow of 100 and 1 SCCM respectively. Pressure in the chamber was maintained at 45±5 torr. The deposition times varied from 2 to 9 hours depending on the run.

It was desired to quantify the effects of oil coatings on diamond film growth. Substrates of 3.0×4.5 cm molybdenum sheet were used. They were cleaned by first scrubbing with a commercial cleanser, and then the surface was scratched by rubbing with 0.25 mm diamond grit polishing compound. The polishing compound was removed by ultrasonically cleaning the substrates, in a solution containing equal volumes of acetone and methanol, for fifteen minutes. After cleaning, the samples were weighed and then some were coated with a thin film of Leybold-Hereaus HE-175 vacuum pump oil.

Figure 2A:
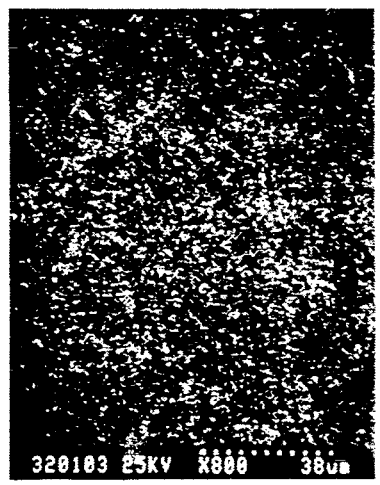
FIGS. 2a and 2b are electron micrographs of typical diamond films according to the present invention.
Figure 2B:
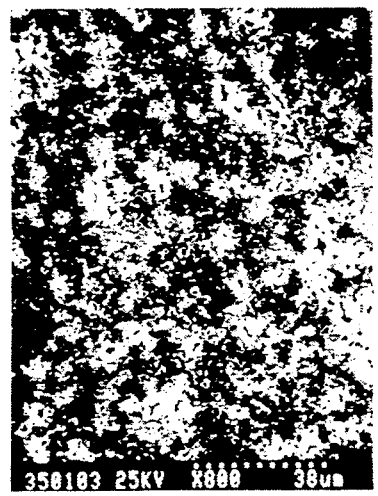

When molybdenum substrates were prepared by the oil coating technique as described previously, continuous free standing films were deposited in 3–4 hours, under the standard conditions described earlier. These films were on the order of 1–4 microns thick with crystal faces of about 0.5 microns. The size and morphology of the crystals which compose the film were very uniform. FIGS. 2a and 2b are electron micrographs of typical films produced according to this invention. The film of FIG. 2a was produced on a Mo substrate after coating with oil. The film of FIG. 2b was produced on a Mo substrate after evaporative deposition of carbon.

To quantify the effects of the oil coating on nucleation density and growth samples were produced using the three techniques described in the section on the first experiment. Measurements of the weight of the molybdenum substrate were made before and after deposition to determine the quantity of diamond produced. The weight measurements were made with a micro-balance accurate to 0.1 mg. After deposition the samples were analyzed with micro-Raman spectroscopy.

Raman is not a quantitative measure of diamond quality since the relative absorption cross-sections for diamond, graphite, and amorphous carbon are not well understood and are dependent on the morphology of the deposits It is reported that Raman is fifty times less sensitive to diamond than it is to graphiteREF. Therefore, if a graphite (1570 and 1350 cm$^{-1}$) or amorphous carbon (1510–1530 cm$^{-1}$) peak is seen, relative to the diamond signal (1332 cm$^{-1}$), it may only mean that the surface contains significant amounts of non-diamond carbon. However, if a strong diamond peak is present then one may be reasonably convinced that the sample is predominately diamond.

Representative Raman spectra are shown in FIGS. 3a–c. Spectrum 3a was taken on a film produced by scratching with 0.25 mm diamond grit and coating with oil. FIGS. 3b and 3c are representative of crystals found on samples that were prepared by only scratching with 0.25 mm diamond grit, and only coating with oil respectively. All of the spectra show strong diamond lines at the expected value of 1332 cm$^{-1}$. FIG. 3a also shows some evidence of graphite. It should be noted however that FIGS. 3b and 3c are high resolution spectra of individual crystals, whereas FIG. 3a is a lower resolution spectrum of a section of a film. The films consistently yield poorer Raman spectra than do the individual crystals This may be due to the fact that, since the films have such small crystals, a significant portion of the spectra comes from the grain boundaries and those areas may have a higher concentration of impurities.

Figure 4:
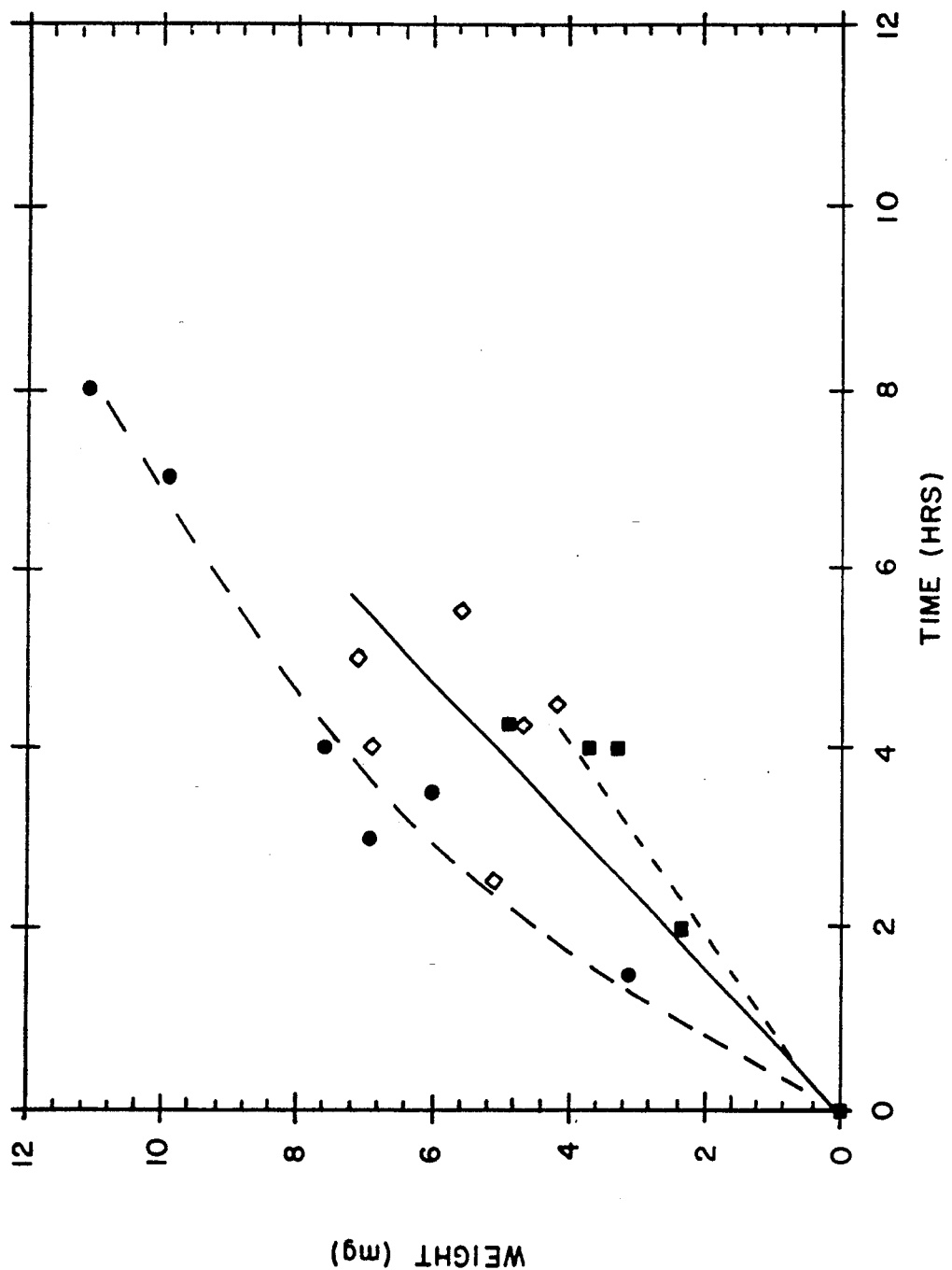
FIG. 4 shows the effects of different surface treatments on weight gain, where ● represents points for oil and diamond, ■ represents points for diamond only, and ◊ shows points for oil only. The large dashes show the curve for oil and diamond, small dashes show the curve for diamond only and the solid line shows the curve for oil only.

FIG. 4 shows the effects on sample weight of preparing molybdenum substrates with the three techniques described previously. The three curves represent weight in milligrams, per a standard 3.0×4.5 cm sample (13.5 cm$^2$), for the three different types of sample preparation (0.25 mm diamond scratching plus oil coating, 0.25 mm diamond scratching only and oil coating only) versus deposition time. It is clear that the combination of scratching with 0.25 mm diamond grit and oil coating produces much more diamond for the same deposition time than does diamond scratching all by itself. Nucleation density is much greater for the samples scratched with diamond and coated with oil than for the samples that were just scratched with diamond. After three to four hours deposition time the scratching plus oil has produced a film whereas the scratching only samples contained only very highly scattered crystals. In fact, coating a molybdenum substrate with oil may increase deposition over the more traditional diamond scratching, however there is a large amount of scatter in this data. The samples which were coated with oil, but not scratched, also consist of scattered crystals but their density is much higher than those samples which were prepared by scratching. The large amount of scatter in the oil only data seems to be a function of how much surface damage is present on the sample. It seems from scanning electron microscope (SEM) analysis that a majority of the nucleation seemed to be occurring on areas of the molybdenum sample that were marred or scratched unintentionally. The molybdenum substrates were simply sheet material, not prepolished in any way. Researchers at Penn State REF have reported that while scratching with diamond provides the best nucleation density, other materials that scratch the substrate surface also enhance nucleation. It may be that coating with oil enhances growth on any existing surface defects.

If substrates are prepared as described above but instead of coating them with pump oil a carbon film is evaporated onto the surface, results similar to coating the substrates with oil are obtained. Both nucleation density and film quality appear to be significantly improved. The crystal morphology also seems similar to that produced by the oil coating experiment.

Example 3

Thin diamond films (>10 μm) were grown on molybdenum (Mo) using a large area, filament assisted chemical vapor deposition FACVD process. The operating parameters were: a filament temperature of 2000°–2400° C., a substrate temperature of 750°–900° C., a gas composition of 99% hydrogen and 1% methane at a total flow rate of 101 SCCM, and a total system pressure of 40–45 torr. The Mo samples were prepared by precleaning, with a commercial cleanser and water, to remove surface dirt and grease. After cleaning the surface of the substrate was scratched with 0.25 micron diamond grit. The substrate was then cleaned ultrasonically in a mixture of methanol and acetone. To further enhance the nucleation density of the diamond films a thin coating of oil was applied to the Mo substrate. The substrate was then placed in the deposition chamber, the chamber is pumped to $1\times 10^{-2}$ torr and then back filled to the desired gas pressure. Once the desired pressure was reached the filament and the sample heaters were activated. Under these conditions the oil coating appeared to produce a thin carbon, or carbide layer on the substrate. This layer provided a much better nucleation site than the bare substrate. Using this system diamond films were grown on substrates as large as $3\times 4.5$ cm in one deposition without changing the substrate, or the filament, position.

The samples produced using FACVD were attached to electrode holders. The sample sides and the edge of the face to be tested were masked with several coats of an alkyd varnish. The electrochemical measurements were made in a deaerated 0.1M NaCl solution using a conventional corrosion cell. The 0.1M NaCl solution was made with reagent grade NaCl and triply distilled water prepared in a quartz still. The solution pH was 5.8; argon was used to deaerate the solution. The samples were immersed in the solution for 24 hours to establish a steady state open circuit potential. The electrochemical behavior was determined potentiostatically for Mo with a continuous diamond film, Mo with an incomplete diamond film, pure Mo (99.999% purity), and Mo exposed to the same conditions under which diamond would be deposited using FACVD without methane. The potential was stepped in 25 to 50 mV increments from the open circuit potential in the anodic (positive) direction. Usually each step was held for 18 minutes. Potentials reported are in reference to the standard calomel electrode (SCE) and current densities are based on the geometric surface area. After anodic polarization, the samples surfaces were examined using optical and scanning electron microscopy. The diamond films were also examined using Raman spectroscopy.

Figure 5:
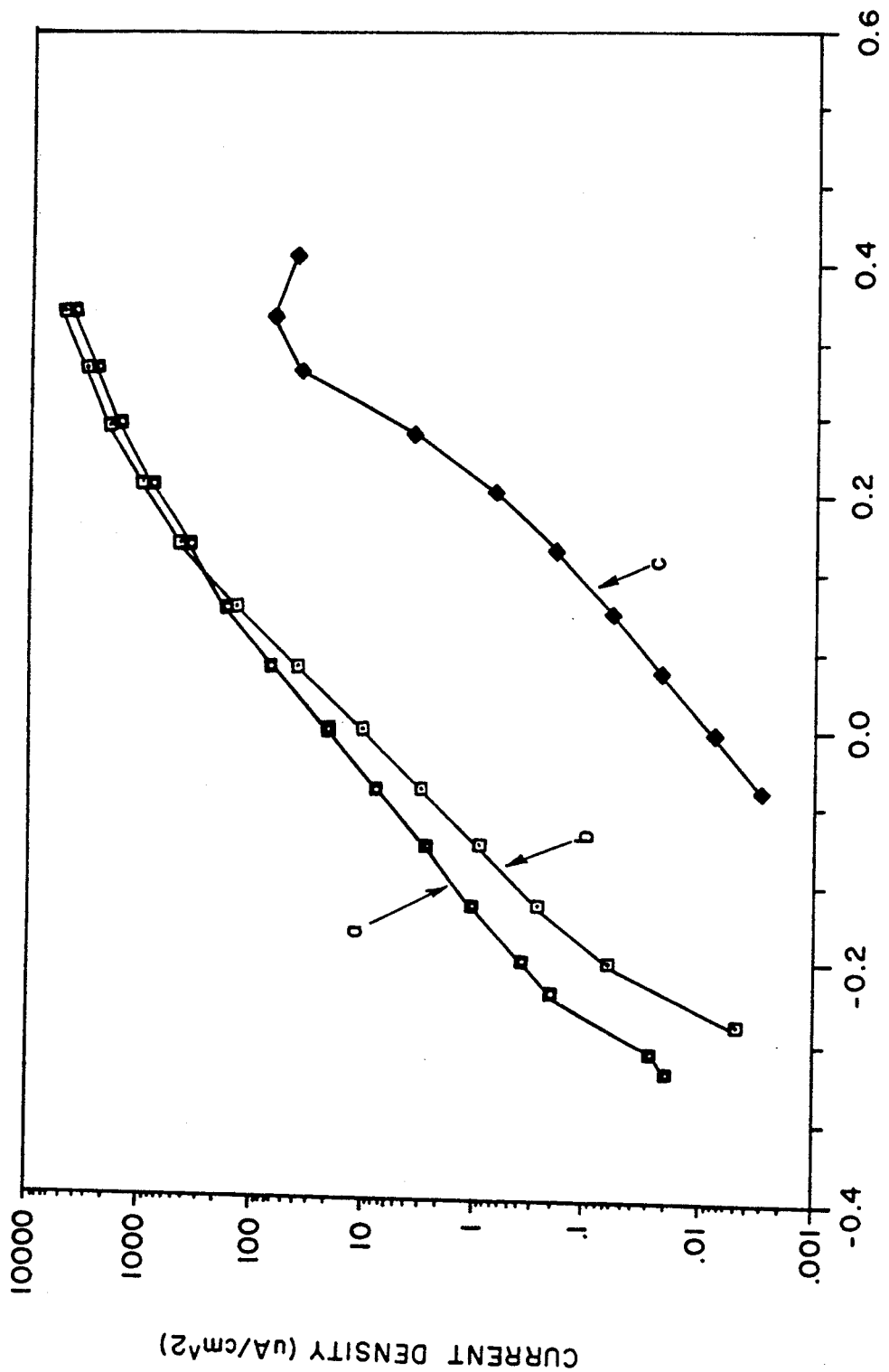
FIG. 5 shows anodic polarization curves for: a) molybdenum (99.999% purity), b) molybdenum exposed to FACVD conditions without diamond deposition, c) a discontinuous diamond film on molybdenum.

The anodic polarization curves for pure Mo, Mo exposed to FACVD conditions without methane, Mo with an incomplete diamond film, and Mo with a continuous diamond film are presented in FIG. 5. Scanning electron and optical microscopy showed scattered pores in the coating of the continuous diamond film before electrochemical testing but the substrate was not visible beneath these pores. Since diamond is expected to be inert to aqueous chloride solutions, the observed current density on the continuous diamond coated sample should represent the current due to the dissolution of the molybdenum substrate through the pores in the diamond film. The current densities for the samples presented in FIG. 5 decrease in the order: pure Mo; FACVD treated Mo; incomplete diamond film on Mo; continuous diamond film on Mo. This indicates that the diamond film was providing a barrier to environmental degradation. After anodic polarization, the Mo substrate was exposed in some areas on the continuous diamond coated sample. Since the exposed areas were not visible before polarization, the diamond film either degraded chemically or failed mechanically in these areas. The diamond film around the exposed areas showed no sign of degradation.

If the porosity observed prior to polarization provided a path for the solution to reach the Mo substrate, and subsequent dissolution of the Mo substrate occurred without degradation to the diamond film as suggested above; then one might expect that the current density should become constant (diffusion limited) due to the constricted geometry of pores or decrease due to a filling of the pores by corrosion products. The current density of the continuous diamond film does, in fact, become constant but not until relatively high potentials. The reason for this behavior is related to disruption of the diamond film by hydrogen gas that is produced during the dissolution of Mo.

Hydrogen production can occur at coating/substrate interfaces during the dissolution of the substrate. The hydrogen can accumulate and produce pressures that can cause the coating to rupture. Hydrogen bubbles were observed on the diamond coated samples during anodic polarization. It appears that hydrogen was produced and accumulated at the diamond film/Mo interface, and produced a sufficient pressure to cause a mechanical failure of the diamond film. This, in turn, exposed a larger area of the substrate to solution and changed the mass transport conditions allowing the current density to increase as the potential increased. That hydrogen will accumulate in a crevice or pit has been discussed previously.

Figure 6:
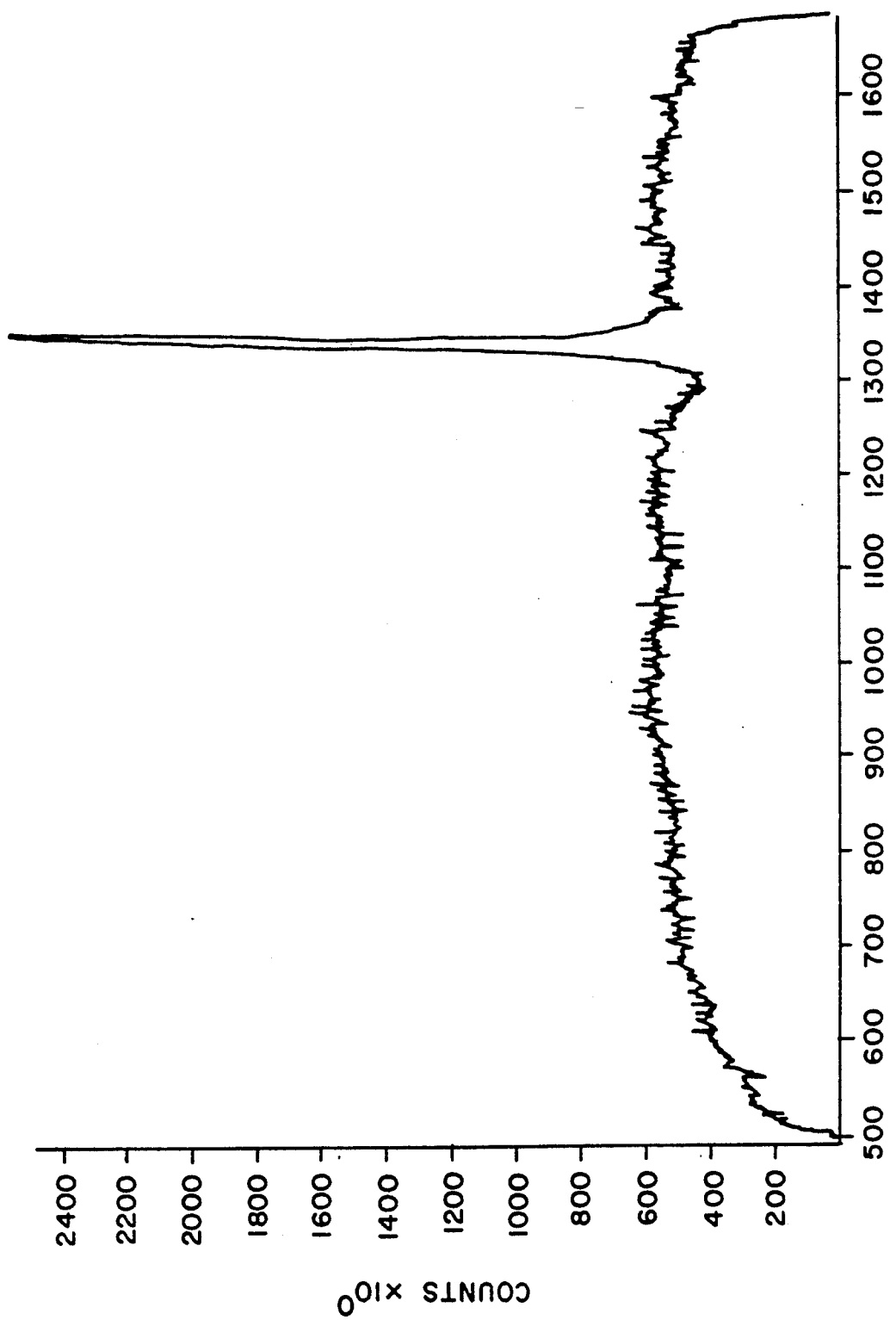
FIG. 6 is a Raman spectrograph of a diamond film produced according to yet another example of the present invention.

Raman analysis of the film showed very strong diamond lines at 1332 cm−1. Amorphous carbon, which is the broad peak centered at 1530 cm−1, is the only other major component. The ratio of the diamond peak intensity to the amorphous carbon is 3.3. Raman spectroscopy is much more sensitive to amorphous carbon than diamond, so the film is clearly comprised of mostly diamond. Raman spectroscopy after anodic polarization showed the presence of a strong diamond line at 1332 cm−1 and an amorphous carbon peak at 1530 cm−1 (see FIG. 6). The spectra is similar to that of diamond films not exposed to electrochemical testing indicating that the diamond film was not degraded as a result of the testing.

So then, diamond films have been shown to be stable to corrosion during anodic polarization in a 0.1M NaCl solution. The continuous diamond film was shown have scattered pores and the observed current density during anodic polarization was attributed to the dissolution of the molybdenum substrate beneath these pores. Hydrogen gas was produced and accumulated at the molybdenum/diamond interface. Hydrogen gas accumulation produced pressures that caused the mechanical failure of the diamond film and exposed larger areas of the substrate to solution. Optical microscopy, scanning electron microscopy and Raman spectroscopy indicated that the diamond film was not degraded during corrosion testing. New methods of production will be able to produce non-porous diamond coatings so that the substrate will be totally protected from the environment and failure of the diamond film by production of $H_2$ gas at the film/substrate interface will not be a problem.

Further information concerning the present invention may be found in Natishan et al, "The Electrochemical Behavior of Diamond coated Molybdenum", Materials Letters, May 1989, incorporated herein by reference.

Obviously, many modifications and variations of the present invention are possible in light of the above teachings. It is therefore to be understood that, within the scope of the appended claims, the invention may be practiced otherwise than as specifically described.

What is claimed is:

1. A method of forming a polycrystalline diamond coating on a surface of a substrate, comprising the steps of:

scratching said substrate surface to form diamond nucleation sites thereon;

coating said scratched surface of said substrate with a selected pattern of a hydrocarbon oil film which, upon thermal decomposition in a non-oxidizing atmosphere at a temperature below the melting point or decomposition temperature of said substrate, is reduced to essentially carbon;

heating said oil film on said substrate, in a non-oxidizing atmosphere, to a temperature at which said thermal decomposition of said oil occurs but below the melting temperature of said substrate;

depositing, by a method which does not destroy or incapacitate said diamond nucleation sites prior to completion of the deposition of diamond thereon, a diamond film upon said surface which has been subjected to said coating and heating steps.

2. The method of claim 1, wherein said diamond film is deposited by chemical vapor deposition.

3. The method of claim 2, wherein said deposition step includes heating said exposed diamond nucleation sites at a diamond generating temperature during said deposition.

4. The method of claim 3, wherein said substrate is maintained at about 500°-1300° C. during said deposition.

5. The method of claim 4, wherein said depositing step includes heating a hydrocarbon feedstock in a non-oxidizing atmosphere to evaporate, thermally decompose and dissociate said hydrocarbon feedstock.

6. The method of claim 5, wherein said depositing step includes heating said hydrocarbon feedstock to over 1700° C.

7. The method of claim 2, wherein said depositing step is done at about 9 to 100 Torr.

8. The method of claim 7, wherein said depositing step is done at about 20 to 100 Torr.

9. The method of claim 1, wherein said substrate is a carbide-forming metal or alloy.

10. The method of claim 1, wherein said substrate is a metal or alloy which is not a carbide former.

11. A method of forming a polycrystalline diamond coating on a surface of a substrate, comprising the steps of:

scratching said substrate surface to form diamond nucleation sites thereon;

coating said scratched surface of said substrate with a hydrocarbon oil film which, upon thermal decomposition in a non-oxidizing atmosphere at a temperature below the melting point or decomposition temperature of said substrate, is reduced to essentially carbon;

heating said oil film on said substrate, in a non-oxidizing atmosphere, to a temperature at which said thermal decomposition of said oil occurs but below the melting point or decomposition temperature of said substrate;

depositing, by chemical vapor deposition, a diamond film upon said surface which has been subjected to said coating and heating steps.

12. The method of claim 1, wherein said scratching is done with diamond grit.

13. The method of claim 11, wherein said scratching is done with diamond grit.

14. A method of protecting a surface of a metal substrate against chemical corrosion, comprising the steps of:

scratching said substrate surface to form diamond nucleation sites thereon;

coating said scratched surface of said substrate with a selected pattern of a hydrocarbon oil film which, upon thermal decomposition in a non-oxidizing atmosphere at a temperature below the melting point or decomposition temperature of said substrate, is reduced to essentially carbon;

heating said oil film on said substrate, in a non-oxidizing atmosphere, to a temperature at which said thermal decomposition of said oil occurs but below the melting point or decomposition temperature of said substrate;

depositing, by a method which does not destroy or incapacitate said diamond nucleation sites prior to completion of the deposition of diamond thereon, a diamond film upon said surface which has been subjected to said coating and heating steps;

subjecting said diamond coated substrate to a chemically corrosive environment.

15. The method of claim 14, wherein said substrate is an electrode and comprises a carbide-forming metal or alloy.

16. The method of claim 14, wherein said diamond film is deposited by chemical vapor deposition.

* * * * *